United States Patent
Heng et al.

(10) Patent No.: US 7,448,018 B2
(45) Date of Patent: Nov. 4, 2008

(54) SYSTEM AND METHOD FOR EMPLOYING PATTERNING PROCESS STATISTICS FOR GROUND RULES WAIVERS AND OPTIMIZATION

(75) Inventors: Fook-Luen Heng, Yorktown Heights, NY (US); Mark Alan Lavin, Katonah, NY (US); Jin-Fuw Lee, Yorktown Heights, NY (US); Chieh-yu Lin, Hopewell Junction, NY (US); Jawahar Pundalik Nayak, Newburgh, NY (US); Rama Nand Singh, Bethel, CT (US)

(73) Assignee: International Business Machines Corporation, Armonk, NY (US)

( * ) Notice: Subject to any disclaimer, the term of this patent is extended or adjusted under 35 U.S.C. 154(b) by 143 days.

(21) Appl. No.: 11/519,617

(22) Filed: Sep. 12, 2006

(65) Prior Publication Data
US 2008/0066047 A1   Mar. 13, 2008

(51) Int. Cl.
G06F 17/50 (2006.01)
G06F 19/00 (2006.01)
G03F 1/00 (2006.01)
G21K 5/00 (2006.01)

(52) U.S. Cl. .................. 716/21; 716/8; 700/120; 430/5; 378/35

(58) Field of Classification Search .......... 716/21, 716/8; 700/120; 430/5; 378/35
See application file for complete search history.

(56) References Cited

U.S. PATENT DOCUMENTS

| | | | |
|---|---|---|---|
| 5,345,513 A * | 9/1994 | Takeda et al. ............... 382/132 |
| 5,987,240 A | 11/1999 | Kay | |
| 6,063,132 A | 5/2000 | DeCamp et al. | |
| 6,275,971 B1 | 8/2001 | Levy et al. | |
| 6,397,373 B1 | 5/2002 | Tseng et al. | |
| 6,418,551 B1 | 7/2002 | McKay et al. | |
| 6,425,113 B1 | 7/2002 | Anderson et al. | |
| 6,732,338 B2 | 5/2004 | Crouse et al. | |
| 6,978,229 B1 * | 12/2005 | Saxena et al. .................. 703/4 |
| 7,085,698 B2 * | 8/2006 | Tsai et al. ..................... 703/13 |
| 7,373,625 B2 * | 5/2008 | Stine et al. ..................... 716/4 |
| 7,386,433 B2 * | 6/2008 | MacLean et al. ............. 703/14 |
| 2005/0289500 A1 * | 12/2005 | Misaka et al. ................. 716/19 |
| 2006/0039597 A1 * | 2/2006 | Kotani et al. ................ 382/144 |
| 2006/0080633 A1 * | 4/2006 | Hsu et al. ..................... 716/19 |
| 2006/0095887 A1 * | 5/2006 | Bigwood et al. ............. 716/19 |
| 2006/0206851 A1 * | 9/2006 | Van Wingerden et al. ..... 716/19 |
| 2006/0236271 A1 * | 10/2006 | Zach ............................. 716/1 |
| 2006/0273266 A1 * | 12/2006 | Preil et al. .................. 250/548 |
| 2006/0288325 A1 * | 12/2006 | Miyamoto et al. ........... 716/19 |
| 2007/0118242 A1 * | 5/2007 | Stine et al. .................. 700/109 |
| 2007/0124708 A1 * | 5/2007 | Torres Robles et al. ........ 716/4 |

(Continued)

*Primary Examiner*—Phallaka Kik
(74) *Attorney, Agent, or Firm*—Keusey, Tutunjian & Bitetto, P.C.; Brian P. Verminski, Esq.

(57) ABSTRACT

A system and method of employing patterning process statistics to evaluate layouts for intersect area analysis includes applying Optical Proximity Correction (OPC) to the layout, simulating images formed by the mask and applying patterning process variation distributions to influence and determine corrective actions taken to improve and optimize the rules for compliance by the layout. The process variation distributions are mapped to an intersect area distribution by creating a histogram based upon a plurality of processes for an intersect area. The intersect area is analyzed using the histogram to provide ground rule waivers and optimization.

20 Claims, 8 Drawing Sheets

U.S. PATENT DOCUMENTS

2007/0261013 A1* 11/2007 Mansfield et al. ............ 716/11
2007/0277145 A1* 11/2007 Scaman ...................... 716/19
2008/0141203 A1* 6/2008 Scaman ....................... 716/9

* cited by examiner

SYSTEM AND METHOD FOR EMPLOYING PATTERNING PROCESS STATISTICS FOR GROUND RULES WAIVERS AND OPTIMIZATION

BACKGROUND

1. Technical Field

The present invention relates to semiconductor chip design, and more particularly to a design tool for optimizing and providing ground rules waivers for chip designs and fabrication procedures.

2. Description of the Related Art

Calculating 2-dimensional and intra-level intersect areas for structures in a semiconductor design remains a challenge within the semiconductor industry. Intersect areas refer to areas common to a pair of layers in layouts of devices or components on a semiconductor chip. These areas are constrained by ground rules which provide requirements for spacings between the components, the component sizes, etc.

Ground rules are restrictions with regard to the geometry of the layout that must be adhered to by the designer of a Very Large Scale Circuit (VLSI) chip. Examples of ground rules are minimum width of a channel, minimum distance between two corners, minimum distance between two features and the like, as is known in the art. Such considerations include component placement on multiple levels of the chip design and therefore in turn the ground rules determine intra-level intersect areas which are then subject to their own rules.

In earlier technology generations, it was acceptable to use simple Monte Carlo software on strictly rectangular geometries to generate ground rules. However, as the industry advances, designs have become more complex and design density has become a greater issue. As such, it is imperative that intersect area software tools progress to a higher level to address the complexities of advanced technologies.

SUMMARY

A system and method of employing patterning process statistics to evaluate ground rules layouts for intersect area analysis includes applying Optical Proximity Correction (OPC) to the layout, simulating images formed by the mask and applying patterning process variation distributions to influence and determine corrective actions taken to improve and optimize the rules for compliance by the layout.

The process variation distributions are mapped into an intersect area distribution by creating a histogram based upon a plurality of processes for an intersect area. The intersect area is analyzed using the histogram to provide ground rule waivers and optimization.

A system employing patterning process statistics for ground rules waivers and optimization includes a processing device configured to apply Optical Proximity Correction (OPC) to alter a ground rules layout to create a mask pattern to which patterning process variation distributions are applied to create, waive and optimize ground rules for semiconductor chip layouts. An analysis module is configured to map the patterning process variation distributions into an intersect area distribution by creating a histogram based upon a plurality of processes for an intersect area and to analyze the intersect area using the histogram to provide ground rule waivers and layout optimization.

These and other objects, features and advantages will become apparent from the following detailed description of illustrative embodiments thereof, which is to be read in conjunction with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Figure 1:
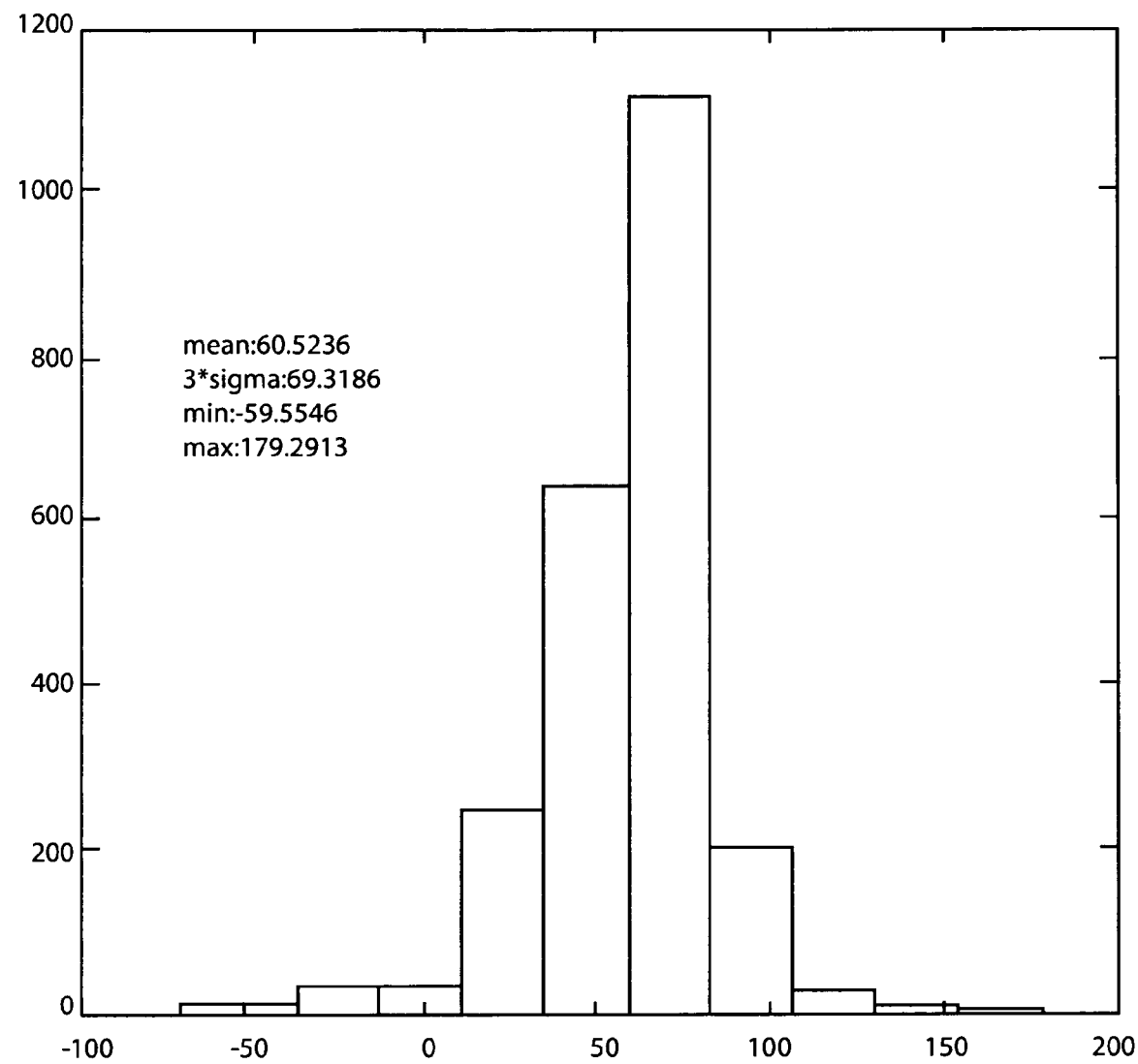
FIG. 1 is an example of a probability distribution for exposure focus for a lithography process where the x-axis is the value of focus in nm and the y-axis includes counts for each bin of the distribution.

Embodiments in accordance with present principles provide a design or analytical tool that addresses layout considerations and intersection area computations for advanced technologies in semiconductor processes. In one embodiment, Optical Proximity Correction (OPC), lithography and non-lithography biases and non-linear critical dimension (CD) tolerances are combined in the same tool.

This tool successfully meets the needs of the semiconductor industry by permitting accurate analysis of complicated, intra-level design layout intersect areas, using production-level OPC which is targeted for the levels being analyzed. OPC includes modifying layout geometries for systematic distortions introduced during fabrication. The OPC tools employ non-printable modifications to a mask or other components to provide desired images for lithography. The intersect area computations from imaged features on the mask, for example, facilitate design rules or ground rules waivers and optimization.

A layout checking step may be employed for ground rules layout verification. This provides simulation based software that predicts what manufacturing distortions with what probability will occur during lithographic patterning. If the magnitude of these errors is determined to be significant, corrections are made by re-examining the ground rules for waivers and optimization followed by the use of some form of OPC such as attenuated or alternating phase shifting or sub-resolution assists. OPC can correct for image distortions, optical proximity effects, photoresist kinetic effects, etch loading distortions, and other various process effects.

Embodiments of the present invention can take the form of an entirely hardware embodiment, an entirely software embodiment or an embodiment including both hardware and software elements. In a preferred embodiment, the present invention is implemented in software, which includes but is not limited to firmware, resident software, microcode, etc.

Furthermore, the invention can take the form of a computer program product accessible from a computer-usable or computer-readable medium providing program code for use by or in conjunction with a computer or any instruction execution system. For the purposes of this description, a computer-usable or computer readable medium can be any apparatus that may include, store, communicate, propagate, or transport the program for use by or in connection with the instruction execution system, apparatus, or device. The medium can be an electronic, magnetic, optical, electromagnetic, infrared, or semiconductor system (or apparatus or device) or a propagation medium. Examples of a computer-readable medium include but are not limited to a semiconductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W) and DVD.

A data processing system suitable for storing and/or executing program code may include at least one processor coupled directly or indirectly to memory elements through a system bus. The memory elements can include local memory employed during actual execution of the program code, bulk storage, and cache memories which provide temporary storage of at least some program code to reduce the number of times code is retrieved from bulk storage during execution. Input/output or I/O devices (including but not limited to keyboards, displays, pointing devices, etc.) may be coupled to the system either directly or through intervening I/O controllers.

Network adapters may also be coupled to the system to enable the data processing system to become coupled to other data processing systems or remote printers or storage devices through intervening private or public networks. Modems, cable modems and Ethernet cards are just a few of the currently available types of network adapters.

The design for an integrated circuit chip may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., Graphic Data System II ("GDSII")) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The methods as described herein are preferably used in the fabrication of integrated circuit chips. However, the present principles may have application in other technologies as well.

Figure 2:
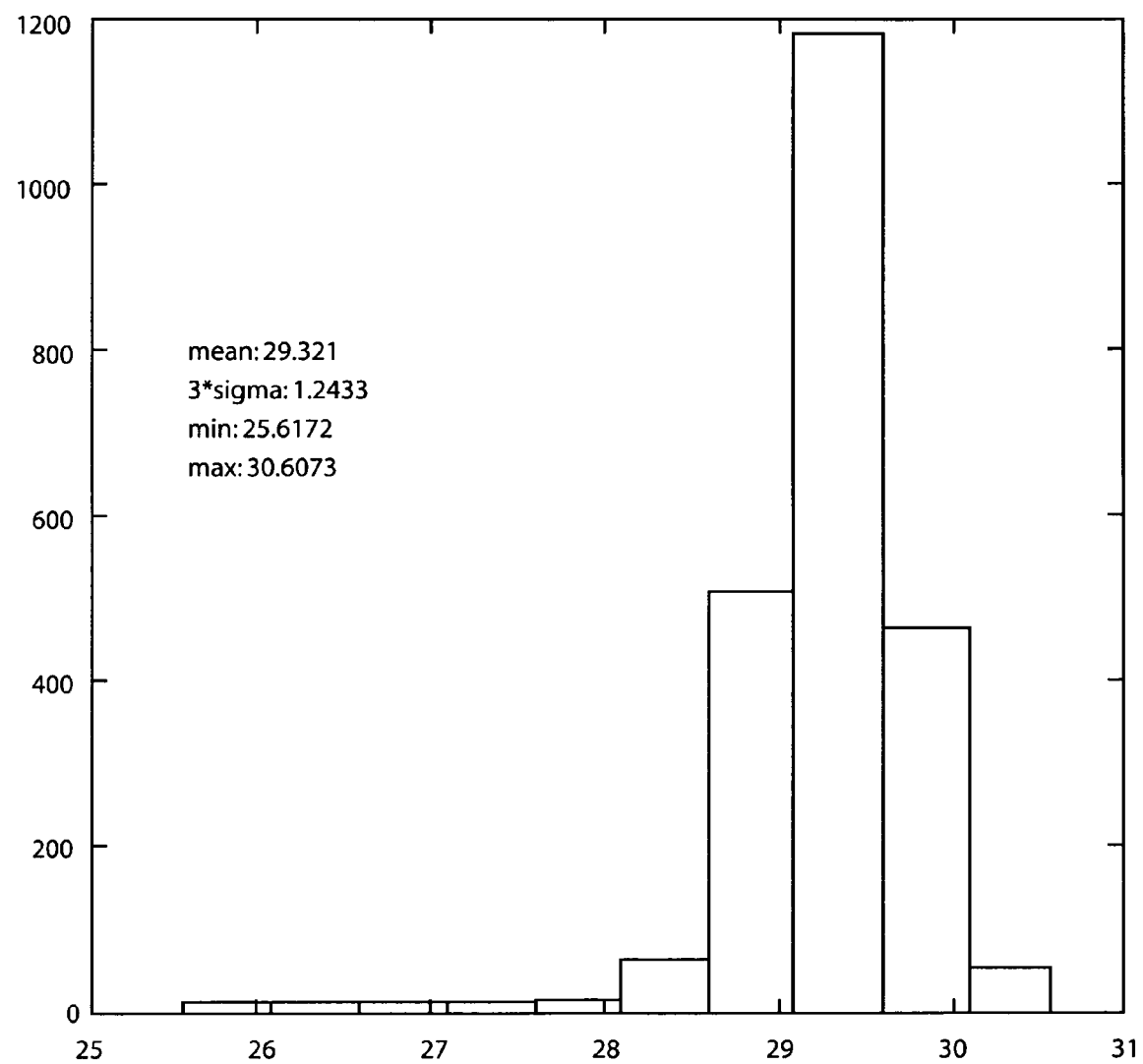
FIG. 2 is an example of a probability distribution for the exposure dose of radiation on the wafer for a lithography process with the x-axis being the exposure dose in arbitrary units and the y-axis being the counts for each bin of the distribution.

Referring now to the drawings in which like numerals represent the same or similar elements and initially to FIGS. 1 and 2, probability distributions for exposure focus (FIG. 1) and exposure dose (FIG. 2) for a lithography process are shown illustratively as examples. During manufacturing of semiconductors, resist coated wafers are exposed with an image of a mask formed by a stepper, as is known in the art.

Focus and dose for the process are maintained at certain nominal levels (e.g., a mean value) which are established to correspond to high fidelity printing of the critical features on a mask. These levels depend, among other things, on the process, the masks and the application in which the lithography is being used. In practice, the exposure is held at these levels with a certain probability distribution which has a 3 sigma value (sigma representing a standard deviation from the nominal values) and which describe the magnitude and the form of the deviation from the nominal values.

The probability distributions depicted in FIGS. 1 and 2 represent a distribution of acceptable process parameters. The example distributions are probability distributions for focus (FIG. 1) measured in linear units (e.g., nm) and for dose (FIG. 2) measured in exposed optical energy per unit area on the wafer, although other parameter distributions may also be employed, e.g. etch bias, level height and etch profile angle, etc. FIG. 1 is an example of a probability distribution for exposure focus for a lithography process where the x-axis is the value of focus (e.g., in nm) and the y-axis includes counts for each bin of the distribution. FIG. 2 is an example of a probability distribution for the exposure dose of radiation on the wafer for a lithography process with the x-axis being the exposure dose in arbitrary units of energy per unit area and the y-axis being counts for each bin of the distribution. For a given feature, e.g., critical dimension or intersect area, the probability distribution is obtained by employing a history of dose or focus settings employed to achieve that feature. This accounts for variations in the manufacturing process up to three sigma from a nominal value.

Additionally, as is generally the case, if multiple masks are involved, there will be similar patterning process parameter variation distributions for each of the parameters such as exposure focus and dose for each of the overlay mask combinations. Other effects such as mask error may be incorporated in a similar manner. These patterning process parameter distributions will be employed as examples in the presentation of systems and methods in accordance with the present principles.

Figure 3:
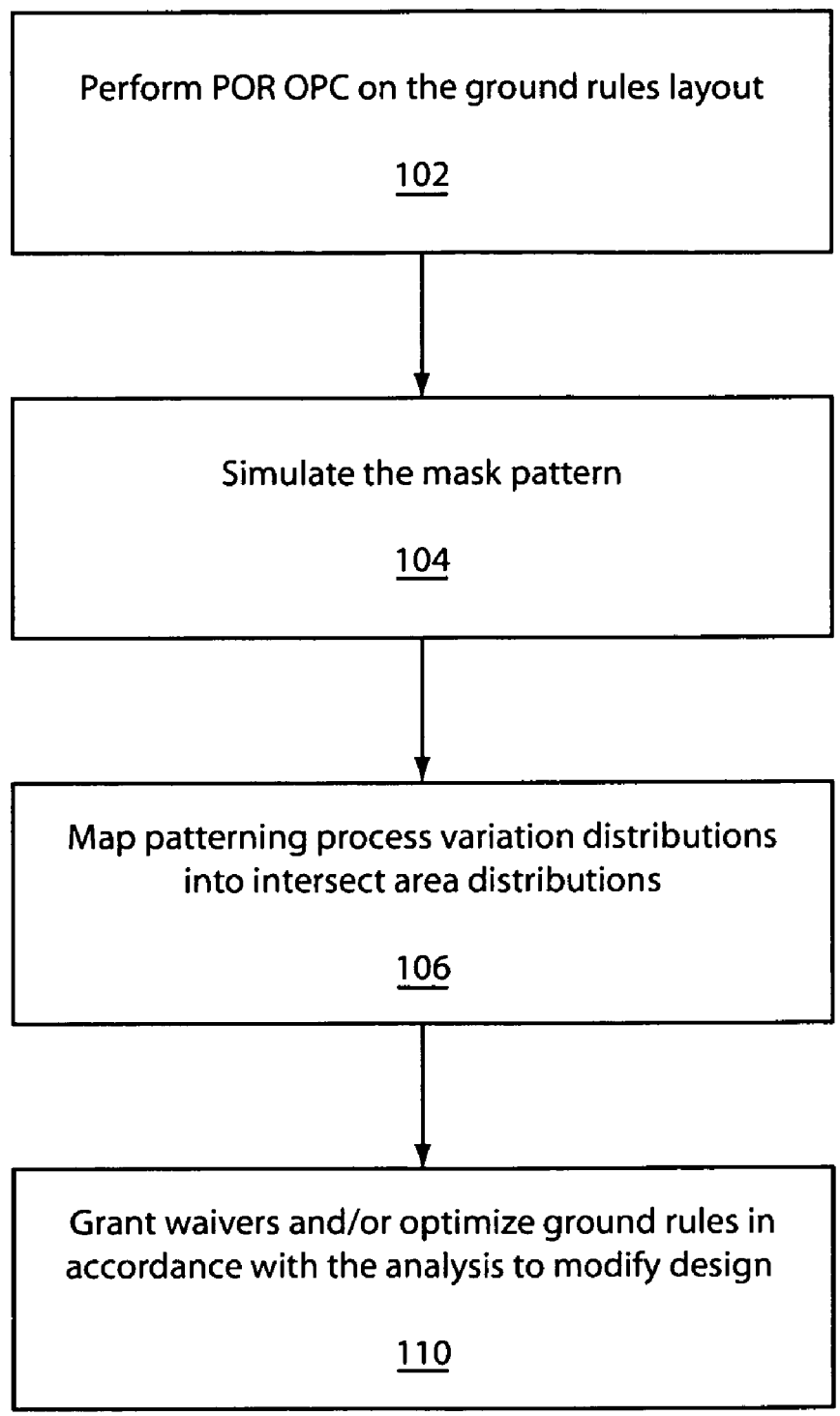
FIG. 3 is a block diagram showing method steps in accordance with a design/analysis tool for performing ground rule waivers and optimization in accordance with the present principles.

Referring to FIG. 3, a block/flow diagram describes an illustrative tool in accordance with the present principles. In block 102, the tool applies plan of record Optical Proximity Correction (POR OPC) recipes to alter the ground rules layout to produce a mask pattern.

Figure 4:
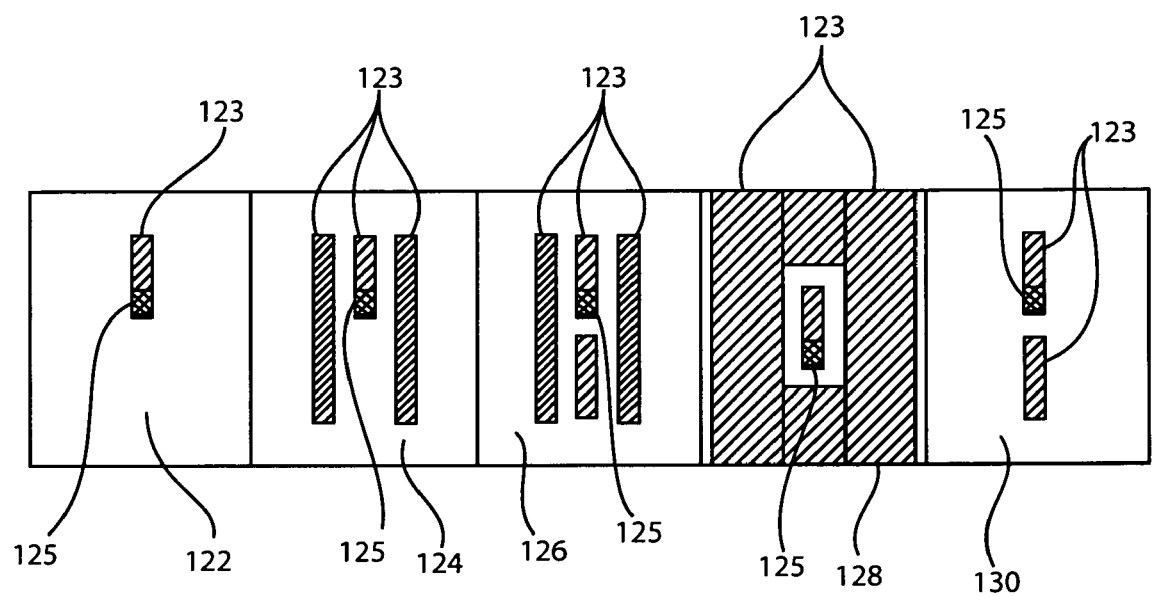
FIG. 4 is a ground rules layout showing 5 cases of CA (first contact layer) and M1 (first metal layer) intersect areas, each in a different context.
Figure 6:
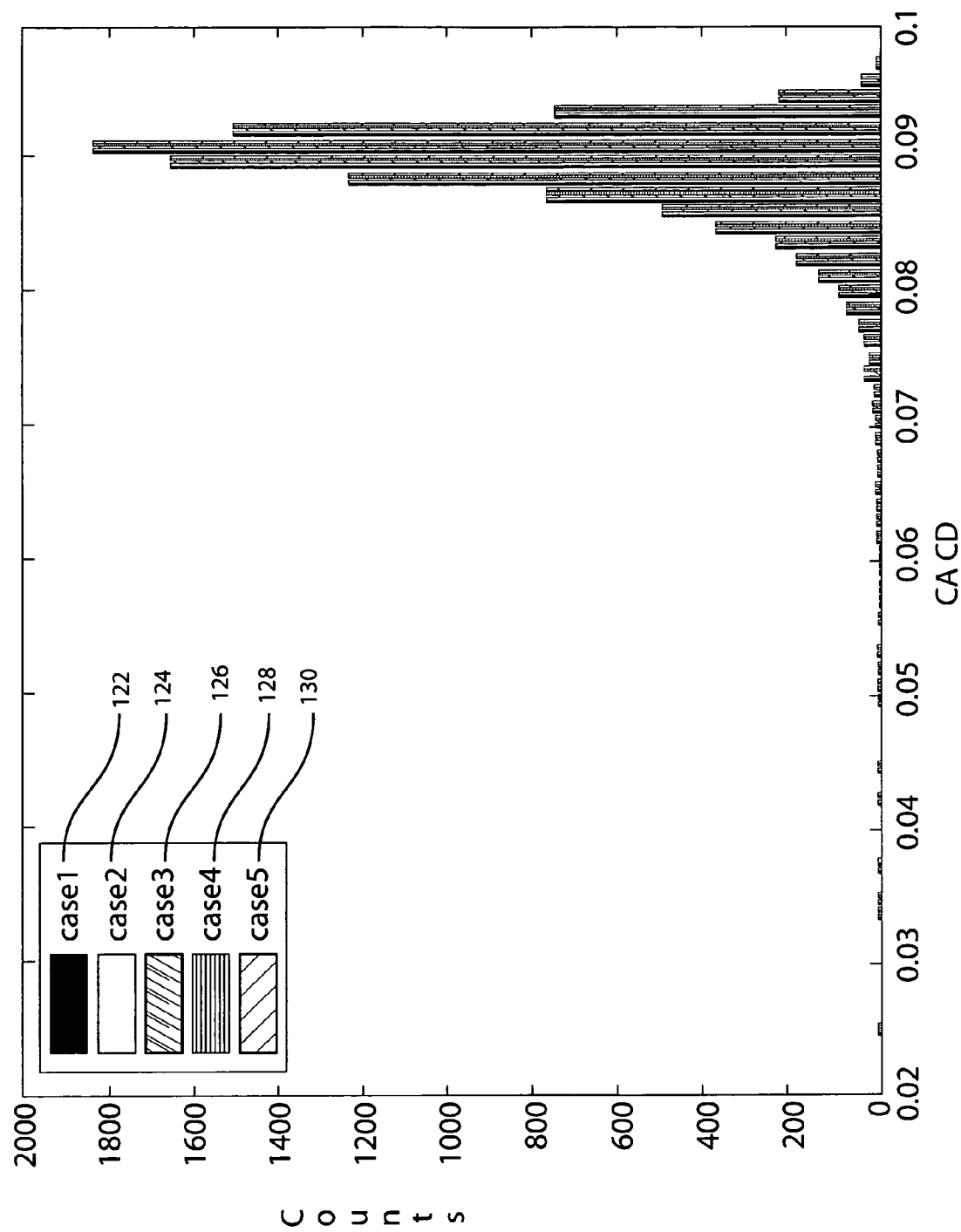
FIG. 6 is a histogram showing the result of a mapping of process variation distribution into a first contact layer (CA) size variation in accordance with present principles.
Figure 7:
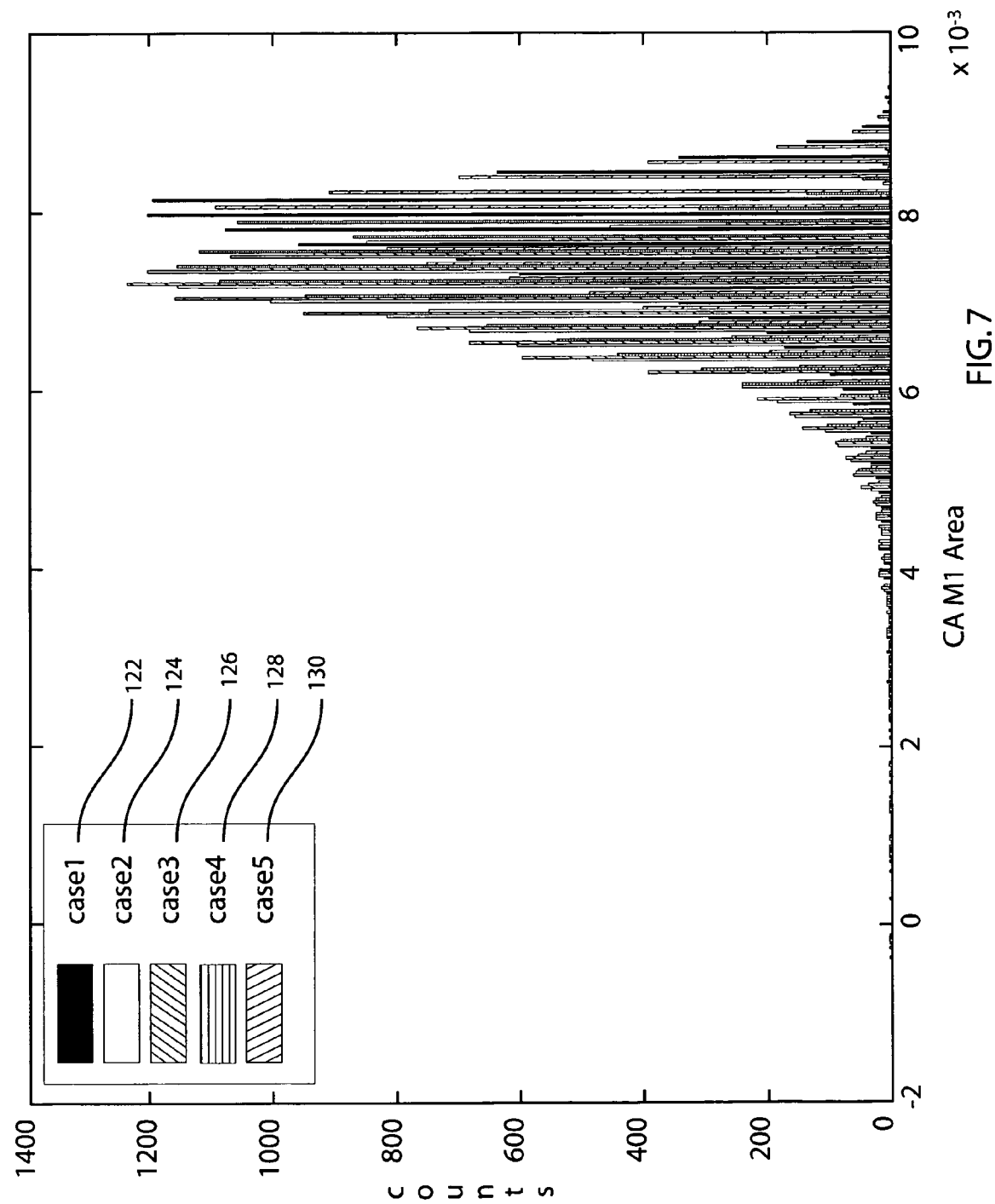
FIG. 7 is a histogram showing the result of a mapping of process variation distribution into the first contact layer/first metal layer (CA/M1) intersect area in accordance with present principles.

Turning to the example of FIG. 4, a ground rules layout includes five scenarios or contexts 122, 124, 126, 128 and 130, which are illustratively shown, respectively, for cases 1-5 depicted in FIGS. 6 and 7. These scenarios are merely illustrative of contexts likely to be found in a layout, for CA/M1 (first contact layer/first metal layer) intersect areas to be analyzed. The design layout ground rule scenarios 122, 124, 126, 128 and 130 depict mask pattern features in an intersect area of a chip design. These features may repeat throughout a chip layout and may be analyzed individually. In each case, features 123 show locations for M1 structures in accordance with ground rules, and features 125 show locations for CA structures in accordance with ground rules.

In block 104 of FIG. 3, images produced by lithographic masks are simulated using lithography models developed for various lithography stages. This simulation includes through-process wafer images which are analyzed for intersect area distributions and ground rules waivers and optimization. This process may be iterative where a corrective action performed by the tool is checked to see if the desired effect is achieved in accordance with the ground rules. As stated, this "test" may be simulated using computer software or actually tested in-situ on wafers.

In one embodiment, this analysis may be based on Monte Carlo analysis methods. In the prior art, it was acceptable to use Monte Carlo analysis simply on strictly rectangular geometries to generate ground rules. In accordance with present principles, process (e.g., lithographic) probability distributions, such as the distributions illustratively shown in FIGS. 1 and 2, are used to generate random process points of focus and dose. A process point may include a set of values for the patterning process parameters, such as, a value of exposure dose and a value of exposure focus.

Figure 5:
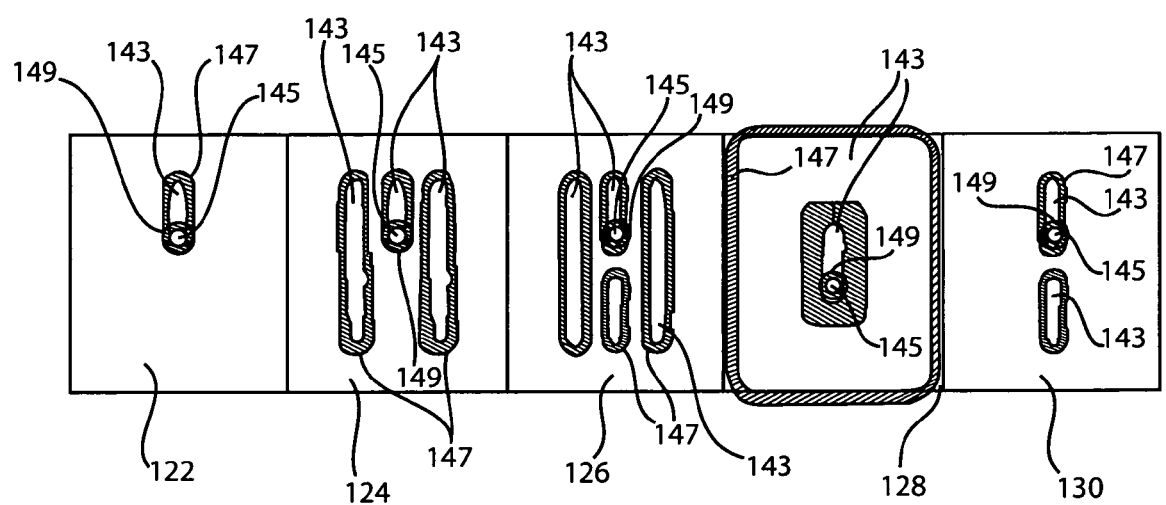
FIG. 5 is the layout shown in FIG. 4 showing simulated CA and M1 structures over a range of process parameters.

Turning to the example in FIG. 5, the layout cases 122, 124, 126, 128 and 130 shown in FIG. 4 are simulated for M1 structures 143 and CA structures 145 over a range of process parameters. The simulated masks (block 104) define regions of process variations. Process variation regions 147 for M1 structures and process variation regions 149 for CA structures are depicted with cross-hatched regions.

For each process point, block 106 employs the simulated images of ground rules layouts (FIG. 5) to compute the corresponding intersect area. By accumulating the intersect area data for all random process points and then sorting the data into different bins, the probability distribution for the intersect area is derived. (See, for example, FIGS. 6 and 7).

This mapping process may be implemented as follows. Given g and h as the probability distribution functions (e.g., the distribution functions provided in FIGS. 1 and 2) of two of the patterning process parameters x and y (where, for example, x and y may be the exposure dose and focus parameters), the ratio of Monte Carlo sample count over the total sample size for one of the parameters, which is taken to be from x to x+dx, and for the other is taken to be from y to y+dy, will be given by $g(x)h(y)dxdy$. If the intersect area function is $a(x,y)$, then the distribution function $f(z)$ for the intersect area will be obtained as:

$$f(z)dz = \int g(x)h(y)dxdy, \text{ for } z \leq a(x,y) \leq z+d$$

where, as is generally understood, g, h and f are the normalized probability distribution functions such that $\int g(x)dx=1$ for all x, and $\int h(y)dy=1$ for all y, and $\int f(z)dz=1$ for all z.

In block 106, a histogram of the intersect area under consideration is preferably produced by plotting $f(z)$. For example, for CA (first contact layer in a chip design) and M1 (first metal layer in the chip design) levels, a histogram is provided over the domain of processes specified by probability distributions for cases of interest such as those illustratively shown in FIG. 6 and FIG. 7 where counts versus CA critical dimensions (FIG. 6) and counts versus CA/M1 area (FIG. 7) are shown.

In FIG. 6, $f(z)$ is shown for dose and focus in achieving a critical dimension in the CA layer for five different contexts (cases 122, 124, 126, 128 and 130). In FIG. 7, $f(z)$ is shown for dose and focus for an intersect area between CA and M1 for different cases 122, 124, 126, 128 and 130. The probability distributions shown in FIGS. 6 and 7 are used to compute the mean, median and standard deviations of the intersect area.

This type of through-process analysis facilitates waivers and optimization of ground rules that are specific to a given technology level with the use of intersect area probability distributions derived from the patterning process parameter's probability distributions by imposing appropriate values on the 3 sigma bounds of the histogram. Thus, a layout describing a ground rule in terms of intersect area may be varied, for example, by moving a contact away or closer to the edge of the metal line, and the resulting histograms may be studied as feedback to optimize the ground rule. In addition, if a layout violates a ground rule because of design considerations, the region where the violation occurs may be studied by the present method to determine the seriousness of the violation from the specified bounds on the intersect area and to decide if a waiver of the rule should be granted. Criteria for determining whether a ground rule can be waived or optimized depends on many factors including but not limited to the types of devices, the application, the materials being employed, the electrical characteristics, the workload, the application, etc.

A VLSI circuit layout needs to obey ground rules to be manufactured within the limitations of the patterning process, but occasionally in a custom layout, a context may arise which is not easily covered by geometry based ground rules. Then, that context becomes a new or waived ground rules layout which needs to be studied in accordance with present principles to obtain a waiver. By providing a region within acceptable process variations, the waivers of ground rules can be granted and still be within acceptable technical specifications. In addition, ground rules may be waived to optimize layout area, improve performance or adjust any other requirement or parameter.

In contrast to the standard Design Rule Checking (DRC), Optical Rule Checking (ORC), and ground rules engineering, the analysis in accordance with present principles takes a holistic approach to design and manufacturing by integrating the plan of record Optical Proximity Correction (POR OPC) as part of the tool and mapping the process variation statistics (FIGS. 1 and 2) back into intersect area statistics (e.g., the histograms in FIGS. 6 and 7) in block 106. In accordance with present principles, process (e.g., lithographic) probability distributions, such as the distributions illustratively shown in FIGS. 1 and 2, are used to generate random process points of focus and dose. For each process point, block 106 employs simulated images of ground rules layouts to compute the corresponding intersect area. By accumulating the intersect area data for all random process points and then sorting into different bins, the necessary intersect area (such as between the first contact and the first metal layer) probability distribution is derived from the designer's perspective, the tool can be integrated with the computation of contact resistance and other relevant electrical performance metrics.

In block 110, the mapped distributions (histograms) are employed to alter the ground rules for waivers or optimization. As illustrated by the five cases in FIGS. 6 and 7, the analysis such as that illustrated in the results presented in FIG. 7 by the five intersect area histograms, may include, e.g., varying space and width tolerances, etc. to create rules specifications and their layouts which more accurately reflect desired pattern geometry and provide ground rule waivers and optimize the rules, particularly with respect to the intersect areas. Devices are preferably manufactured in accordance with these changes.

In accordance with experiments by the present inventors, several CA to M1 test cases were run. These tests have shown that the tool can handle complicated geometries, generate through process wafer image contours, use dose and focus lithography data, and map the patterning process variations into Monte Carlo intersect area distributions. The results produced correlate well.

Figure 8:
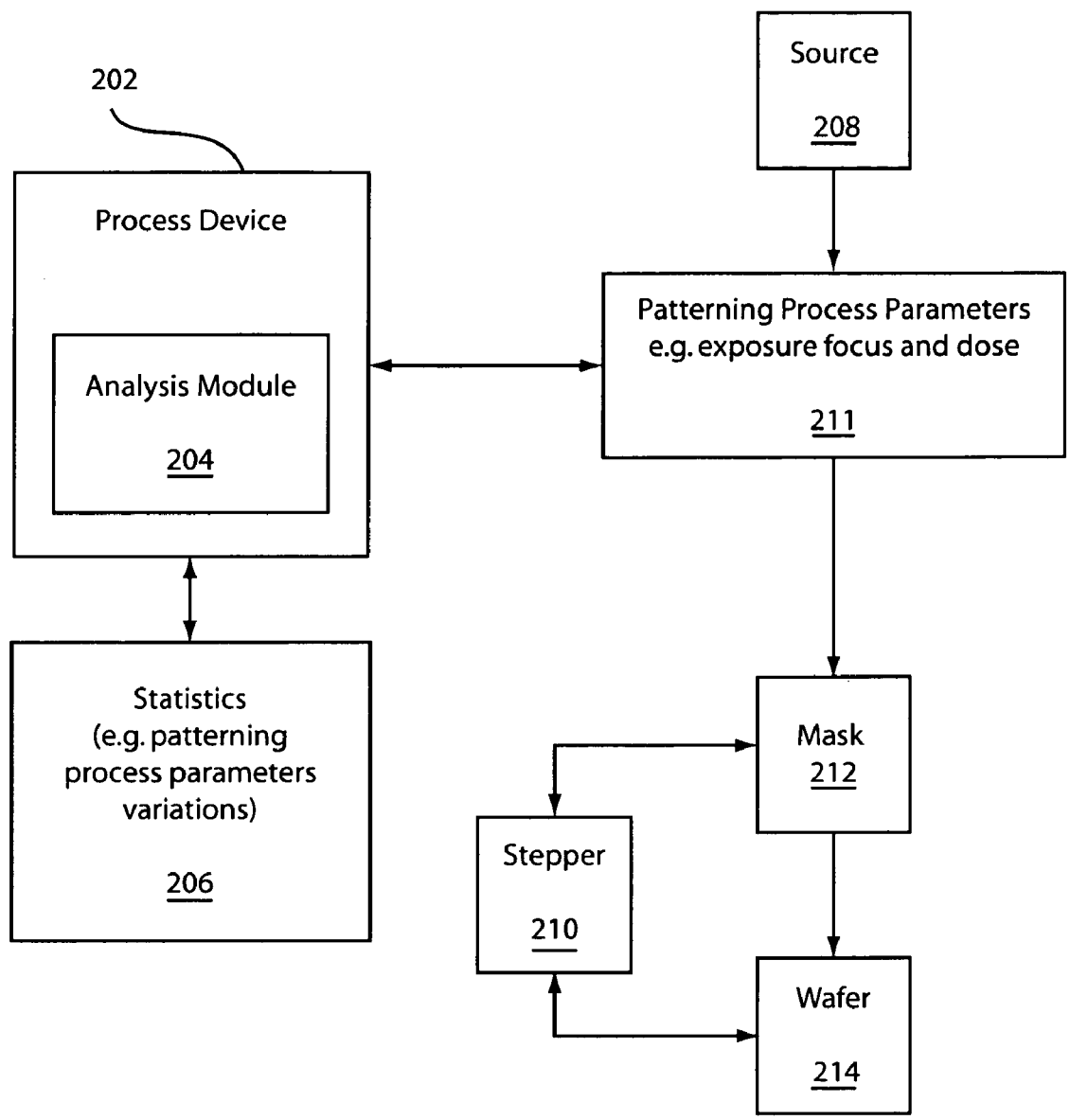
FIG. 8 is a block diagram showing a system employing a design/analysis tool for performing ground rules waivers and optimization in accordance with the present principles.

Referring to FIG. 8, a system 200 for employing statistical patterning process parameters for ground rules waivers and optimization is illustratively shown in accordance with present principles. System 200 advantageously provides the process and functions for granting waivers and optimization of layout ground rules, and handles OPC, polygonal geometries, non-lithography biases and non-linear critical dimension (CD) tolerances in a same tool. System 200 includes a processing device 202, which preferably includes a computer. Processing device 202 includes an analysis/design module 204 employed in creating, waiving and optimizing layout ground rules for chip or board designs. Module 204 includes a POR program in accordance with the present principles. Module 204 incorporates statistics 206 for patterning processes to be mapped into the intersect area statistics by Monte Carlo simulation for creating, waiving and optimizing layout ground rules resulting in a circuit layout with features having high printability probability on the masks 212.

Statistics 206 preferably include probability distributions for exposure focus and dose, although other parametric distributions may be employed. These distributions are employed to generate distributions of intersect areas from a Monte Carlo analysis. Using these statistical distributions, waivers of ground rules can be determined by relaxing the bounds on the standard deviations of the distributions and working with a process team to decide whether the waivers provide satisfactory results.

Masks 212 are aligned to a wafer 214 using a stepper 210 to incrementally move and position the mask 212 relative to the wafer 214. A radiation source 208 illuminates the mask 212 to cause an image to form on the wafer 214 to provide a lithographic image of a mask that has resulted from a layout completed with optimal ground rules with respect to patterning process parameters 211 which include the exposure focus and dose. In addition to OPC techniques, the present principles employ statistical patterning process parameters such as dose, focus, etc. variation data to optimize ground rules by examining the resulting variation of the size and shape of the intersect areas of the ground rules layouts that enable a best rendition of the mask into a wafer image by enforcing optimized ground rules with the approach illustrated here.

Having described preferred embodiments of a system and method system for employing patterning process statistics for ground rules waivers and optimization (which are intended to be illustrative and not limiting), it is noted that modifications and variations can be made by persons skilled in the art in light of the above teachings. It is therefore to be understood that changes may be made in the particular embodiments disclosed which are within the scope and spirit of the invention as outlined by the appended claims. Having thus described aspects of the invention, with the details and particularity required by the patent laws, what is claimed and desired protected by Letters Patent is set forth in the appended claims.

What is claimed is:

1. A method for employing patterning process statistics for ground rules waivers and optimization, comprising:

applying Optical Proximity Correction (OPC) to alter a ground rules layout using plan of record process methods to improve mask pattern images;

simulating images produced by a mask;

mapping patterning process variation distributions into an intersect area distribution by creating a histogram based upon a plurality of processes for the intersect area wherein mapping includes accumulating intersect area data for random process points and sorting the intersect area data into different bins, wherein given g and h as probability distribution functions, a ratio of a Monte Carlo sample count over a total sample size is given by $g(x)h(y)dxdy$, and if an intersect area function is $a(x,y)$, then a distribution function $f(z)$ for the intersect area is: $f(z)dz = \int g(x)h(y)dxdy$, for $z \leq a(x,y) \leq z+d$ where, g, h and f are normalized probability distribution functions such that $\int g(x)dx=1$ for all x, and $\int h(y)dy=1$ for all y, and $\int f(z)dz=1$ for all z; and analyzing the intersect area using the histogram to provide ground rule waivers and optimization.

2. The method as recited in claim 1, wherein simulating images produced by a mask includes simulating images on computer through process lithography models.

3. The method as recited in claim 1, wherein applying OPC to alter a mask pattern using plan of record process methods includes applying lithographic exposure focus and dose distributions.

4. The method as recited in claim 1, wherein mapping patterning process variation distributions into an intersect area distribution includes analyzing the histogram to grant acceptable ground rules waivers and acceptable geometrical changes for a given a set of ground rules.

5. The method as recited in claim 1, further comprising, modifying a ground rules layout based upon the analyzing step.

6. The method as recited in claim 5, further comprising, fabricating a semiconductor chip in accordance with modified ground rules.

7. A computer program product employing patterning process statistics for ground rules waivers and optimization, comprising a computer useable medium including a computer readable program, wherein the computer readable program when executed on a computer causes the computer to:

applying Optical Proximity Correction (OPC) to alter a ground rules layout using plan of record process methods to improve mask pattern images;

simulating images produced by a mask;

mapping patterning process variation distributions into an intersect area distribution by creating a histogram based upon a plurality of processes for the intersect area wherein mapping includes accumulating intersect area data for random process points and sorting the intersect area data into different bins, wherein given g and h as probability distribution functions, a ratio of a Monte Carlo sample count over a total sample size is given by $g(x)h(y)dxdy$, and if an intersect area function is $a(x,y)$, then a distribution function $f(z)$ for the intersect area is: $f(z)dz = \int g(x)h(y)dxdy$, for $z \leq a(x,y) \leq z+d$ where, g, h and f are normalized probability distribution functions such that $\int g(x)dx=1$ for all x, and $\int h(y)dy=1$ for all y, and $\int f(z)dz=1$ for all z; and analyzing the intersect area using the histogram to provide ground rule waivers and optimization.

8. The computer program product as recited in claim 7, wherein simulating images produced by a mask includes simulating images on computer through process lithography models.

9. The computer program product as recited in claim 7, wherein applying OPC includes applying lithographic exposure focus and dose distributions.

10. The computer program product as recited in claim 7, wherein mapping the patterning process variation distributions into an intersect area distribution by creating a histogram includes analyzing the histogram to grant acceptable ground rules waivers and acceptable geometrical changes for a given a set of ground rules.

11. The computer program product as recited in claim 7, wherein the program further causes the computer to modify a ground rules layout based upon the analyzing step.

12. The computer program product as recited in claim 11, wherein the program further causes the computer to fabricate a semiconductor chip in accordance with modified wound rules.

13. A system employing patterning process statistics for ground rules waivers and optimization, comprising:
a processing device configured to apply Optical Proximity Correction (OPC) to alter a ground rules layout to create a mask pattern to which patterning process variation distributions are applied to create, waive and optimize ground rules for semiconductor chip layouts; and
an analysis module configured to map the patterning process variation distributions into an intersect area distribution by creating a histogram based upon a plurality of processes for an intersect area and to analyze the intersect area using the histogram to provide ground rule waivers and layout optimization wherein the map includes accumulated intersect area data for random process points and sorts the intersect area data into different bins, wherein given g and h as probability distribution functions, a ratio of a Monte Carlo sample count over a total sample size is given by $g(x)h(y)dxdy$, and if an intersect area function is $a(x,y)$, then a distribution function $f(z)$ for the intersect area is: $f(z)dz=\int g(x)h(y)dxdy$, for $z \leq a(x,y) \leq z+d$ where, g, h and f are normalized probability distribution functions such that $\int g(x)dx=1$ for all x, and $\int h(y)dy=1$ for all y, and $\int f(z)dz=1$ for all z.

14. The system as recited in claim 13, wherein the analysis module includes a software program run on the processing device.

15. The system as recited in claim 13, wherein processing device includes through process lithography models to simulate images produced by a mask.

16. The system as recited in claim 13, wherein the patterning process variation distributions include lithographic exposure focus and dose distributions.

17. The system as recited in claim 13, wherein the analysis module determines ground rules waivers and acceptable geometrical changes for a given a set of ground rules based upon the histogram.

18. The system as recited in claim 13, wherein the analysis module outputs a modified layout according to waived and optimized ground rules.

19. The system as recited in claim 18, wherein the modified layout is employed to fabricate a semiconductor chip.

20. The system as recited in claim 18, wherein an intersect area includes an area of overlap between a pair of layers in a layout.

* * * * *